United States Patent [19]

Longley

[11] 4,371,849
[45] Feb. 1, 1983

[54] EVANESCENT-MODE MICROWAVE OSCILLATOR

[75] Inventor: Stuart R. Longley, Limpsfield, England

[73] Assignee: U.S. Philips Corporation, New York, N.Y.

[21] Appl. No.: 131,346

[22] Filed: Mar. 19, 1980

[30] Foreign Application Priority Data

Mar. 19, 1979 [GB] United Kingdom ............... 7909487

[51] Int. Cl.$^3$ ............................................. H03B 5/18
[52] U.S. Cl. ................................. 331/96; 331/107 G; 331/177 V; 331/107 DP
[58] Field of Search .............. 331/96, 97, 99, 107 DP, 331/107 G, 177 V

[56] References Cited

U.S. PATENT DOCUMENTS 3,919,666  11/1975  Posner et al. .............. 331/107 G X
4,305,049  12/1981  Bastida ..................... 331/107 DP X

OTHER PUBLICATIONS

Ivanek et al, Electronics Letters, May 15, 1969, vol. 5, No. 10, pp. 214–216.

Primary Examiner—Siegfried H. Grimm
Assistant Examiner—Edward P. Westin
Attorney, Agent, or Firm—Robert J. Kraus

[57] ABSTRACT

A microwave evanescent-mode oscillator comprises a length of waveguide W1 having a cut-off frequency higher than the working frequency of the oscillator together with a Gunn element G disposed within the waveguide characterized in that the oscillator comprises, spaced in sequence along the waveguide a Gunn element G post-coupled into the waveguide and spaced from a first end of the waveguide, a capacitive member C and at the other end of the waveguide an end wall formed by a diaphragm D having therein an output aperture I for coupling out energy from the waveguide.

9 Claims, 2 Drawing Figures

EVANESCENT-MODE MICROWAVE OSCILLATOR

BACKGROUND OF THE INVENTION

This invention relates to a microwave evanescent-mode oscillator comprising a length of waveguide having a cut-off frequency higher than the working frequency of the oscillator together with a Gunn element disposed within the waveguide. Such oscillators are discussed in a communication entitled "Investigation of waveguide-below-cutoff resonators for solid-state active devices" by Ivanek, Shyam and Reddi in Electronic Letters dated May 15, 1969 at pages 214 to 216.

The object of the present invention is to provide an improved device.

SUMMARY OF THE INVENTION

According to the invention a microwave oscillator of the kind referred to above comprises, spaced in sequence along the waveguide, a Gunn element post-coupled into the waveguide and spaced from a first end of the waveguide, a capacitive member and at the other end of the waveguide an end wall having therein an output aperture for coupling out energy from the waveguide.

The capacitive member may be a metal or dielectric post or a varactor.

The first end of the waveguide may be terminated in a short circuit or may be open.

BRIEF DESCRIPTION OF THE DRAWING

Embodiments of the invention will now be described with reference to the accompanying diagrammatic drawings in which.

DESCRIPTION OF THE PREFERRED EMBODIMENTS

Figure 1:
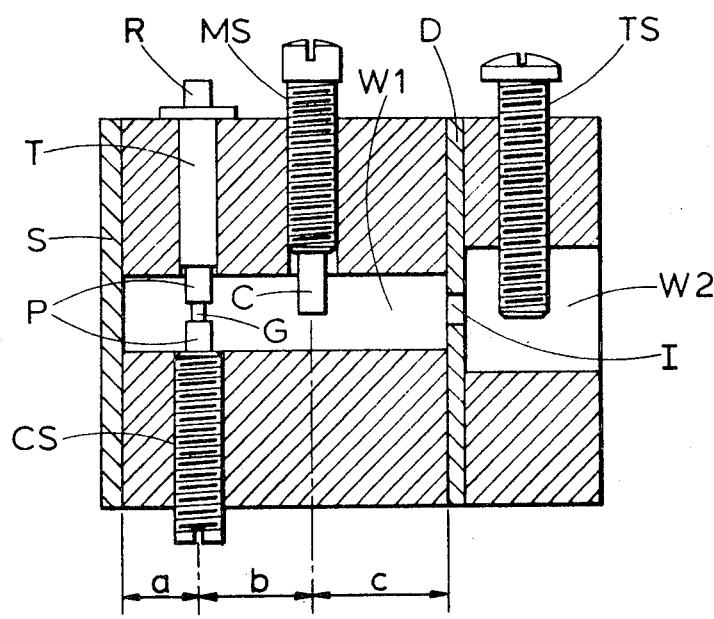
FIG. 1 illustrates an embodiment in cross-section.
Figure 2:
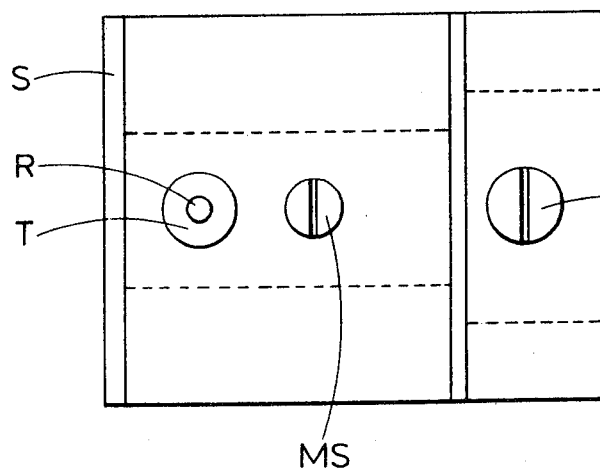
FIG. 2 is a plan view of the embodiment.

Referring now to FIGS. 1 and 2 a microwave oscillator device comprises an oscillator portion in the form of a length of waveguide W1 so dimensioned that the working frequency of the oscillator is below the cut-off frequency of the waveguide. The left-hand end of the waveguide W1, as viewed in FIG. 1, is closed by a plate S forming a short-circuit wall and adjacent this wall is disposed a Gunn element G which is supported within the waveguide by short coupling posts P formed one on the end of an adjustable brass clamping screw CS and the other on the end of a voltage supply rod R insulated from the waveguide wall by a tubular insert T of electrically insulating material.

Further along the waveguide is a capacitive member formed by a post C of low-loss dielectric material which is mounted on a mounting screw MS so that its depth of penetration into the waveguide W1 can be adjusted so as to provide a mechanical method of varying the frequency of the oscillator. At the end of the waveguide remote from the short-circuiting wall S is a diaphragm D which again forms a substantial short circuit at this end of the waveguide but which is apertured to form an iris I. However, as the effect within waveguide W1 of the iris I in the diaphragm D is small, the waveguide W1 together with the capacitive post C acts in the main as a cavity resonator with a stationary field pattern including an evanescent mode at the operating frequency which transports power to the load through the iris I and also propagating modes and evanescent modes at harmonics of the operating frequency, this cavity being tuned, in a mechanical manner, by adjustment of the tuning screw MS. At the side of the diaphragm remote from the waveguide W1 is a short length of second waveguide W2 dimensioned to support propagation at the working frequency of the oscillator and mounted in the wide wall of this waveguide W2 is a tuning screw TS for tuning the iris. The iris diameter and the tuning screw penetration principally control the amount of power extracted from the waveguide W1 at the fundamental frequency of operation.

If desired, of course, the dielectric member C and screw MS may be merely replaced by a varactor assembly. Again, the dielectric member C and screw MS may be replaced by a simple metal tuning screw, similar to TS, which will also have a capacitive effect. Although all these capacitive members have been described as being adjustable so as to provide tuning variation this is of course not essential. It will also be understood that although the mere mechanics of applying appropriate voltages to the Gunn element and the varactor have not been described these will be familiar to those skilled in the art.

In the embodiment illustrated in FIGS. 1 and 2 satisfactory results have been obtained with an arrangement having the following dimensions: a 7.6 mm b 10 mm and c 13 mm. Waveguide W1 was of WG 19 (cut-off frequency 11.6 GHz) and for waveguide W2, WG 16 was found to be suitable at an operating frequency of 8 6 to 11.6 GHz.

Using a Gunn diode type CXY 11 available from Mullard Limited the output power was, typically, 15 milliwatts; three diaphragms respectively having circular irises of 5.5, 6.5 and 7 mm were found satisfactory. The external Q-factor was greater than 2000.

Using a Gunn diode type MA 49117-118 available from Microwave Associates (a United States company) and a diaphragm with a circular iris 4 mm in diameter, an output of 100 mW was obtained. The external Q-factor was greater than 1000.

In a further embodiment constructed for use at Q-band, the overall cavity length a+b+c, see FIG. 1, was 11 mm and the Gunn diode was a type MA 49172 again from Microwave Associates: power outputs of from 10 to 60 mW were obtained over the range 33 to 40 GHz.

During the course of investigations measurements on both the X-band and Q-band devices were made with the plate S removed and it was found that the presence of the plate made no significant difference. Thus, although not specifically illustrated it will be understood that the invention also includes an arrangement where the end of the waveguide W1 is open instead of terminated in a short circuit.

I claim:

1. A microwave evanescent-mode oscillator comprising a length of rectangular waveguide having a cut-off frequency higher than the working frequency of the oscillator together with a Gunn element disposed within the waveguide characterised in that the oscillator comprises, spaced in sequence along the longitudinal axis of the waveguide, the Gunn element post-coupled into the waveguide and spaced from a first end of the waveguide, a capacitive member and at the opposite end of the waveguide an end wall perpendicular to said longitudinal axis having therein an output aperture for coupling out energy at said working frequency from the waveguide.

2. An oscillator as claimed in claim 1 characterised in that the capacitive member is a dielectric post.

3. An oscillator as claimed in claim 1 characterised in that the capacitive member is a metal post.

4. An oscillator as claimed in claim 1 characterised in that the penetration into the waveguide of the capacitive member is adjustable whereby the tuning of the oscillator can be varied mechanically.

5. An oscillator as claimed in claim 1 characterised in that the capacitive member is a varactor.

6. An oscillator as claimed in claim 1 characterised in that the output aperture couples into a second length of waveguide which has a cut-off frequency below the working frequency of the oscillator.

7. An oscillator as claimed in claim 6 characterised in that the second length of waveguide is provided with an adjustable tuning screw.

8. An oscillator as claimed in claim 1 characterised in that the said first end of the waveguide is terminated in a short circuit.

9. An oscillator as claimed in claim 1 characterised in that the said first end of the waveguide is open.

* * * * *